United States Patent
Richardson et al.

(10) Patent No.: US 6,313,620 B1
(45) Date of Patent: Nov. 6, 2001

(54) DETECTOR SYSTEM FOR IDENTIFYING THE FREQUENCY OF A RECEIVED SIGNAL USEFUL IN A CHANNELIZED RECEIVER

(75) Inventors: David Livingstone Richardson, Arlington Hts.; Kenneth Duane Gorham, Palatine, both of IL (US)

(73) Assignee: Northrop Grumman Corporation, Los Angeles, CA (US)

( * ) Notice: Subject to any disclaimer, the term of this patent is extended or adjusted under 35 U.S.C. 154(b) by 981 days.

(21) Appl. No.: 08/528,130

(22) Filed: Sep. 14, 1995

(51) Int. Cl.[7] .................................................. G01R 23/16
(52) U.S. Cl. ..................................... 324/76.31; 324/76.29
(58) Field of Search .............................. 324/76.31, 76.39, 324/76.19, 76.22, 76.29; 455/178.1, 226.1

(56) References Cited

U.S. PATENT DOCUMENTS

| | | | |
|---|---|---|---|
| 2,886,777 | * 5/1959 | Hurvitz | 324/76.19 |
| 3,364,425 | * 1/1968 | Peterson et al. | 324/76.31 |
| 3,473,121 | * 10/1969 | Hurtig | 324/76.31 |
| 3,515,990 | * 6/1970 | Robertson | 324/76.31 |
| 4,301,454 | 11/1981 | Bailey | 343/18 |
| 4,307,340 | * 12/1981 | Inami et al. | 324/76.31 |
| 4,352,208 | 9/1982 | Schroeder | 455/266 |
| 4,443,757 | * 4/1984 | Bui | 324/76.31 |
| 4,556,982 | * 12/1985 | Dunn | 455/226.1 |
| 4,622,519 | 11/1986 | Goldman | 328/137 |
| 4,797,931 | * 1/1989 | Furukawa et al. | 324/76.31 |
| 4,956,644 | * 9/1990 | Leahy et al. | 324/76.31 |
| 5,097,221 | 3/1992 | Miller | 329/318 |
| 5,129,100 | 7/1992 | Caporizzo et al. | 455/118 |
| 5,157,348 | 10/1992 | Deveau | 330/279 |
| 5,251,332 | 10/1993 | Hansen | 455/200.1 |

* cited by examiner

Primary Examiner—Safet Metjahic
Assistant Examiner—Vincent Q. Nguyen
(74) Attorney, Agent, or Firm—Terry J. Anderson; Karl J. Hoch, Jr.

(57) ABSTRACT

A method, and apparatus for accomplishing the method, for determining the frequency of an RF signal that operates by sequentially applying a received RF signal to sequentially selected individual filters having predetermined frequency pass bands and comparing the magnitudes of the filtered and unfiltered RF signals. The frequency of the RF signal is determined as being within the predetermined frequency pass band of a filter that outputs a largest magnitude output signal relative to the magnitude of the RF signal. Signals of insufficient magnitude are not processed by the system.

9 Claims, 3 Drawing Sheets

DETECTOR SYSTEM FOR IDENTIFYING THE FREQUENCY OF A RECEIVED SIGNAL USEFUL IN A CHANNELIZED RECEIVER

FIELD OF THE INVENTION

This invention relates generally to RF receivers and, in particular, the invention relates to a detector system for identifying the frequency of an RF signal.

BACKGROUND OF THE INVENTION

Multiple channel receivers are capable of receiving signals over various bands of the frequency spectrum. When an incoming signal having a known frequency is to be received, a receiver that is tuned to the particular channel corresponding to the signal's frequency can receive the signal. A difficulty arises, however, when the signal to be received is of an unknown frequency. In such a case, the receiver must determine the incoming signal's frequency in order to then tune to the appropriate channel and receive the signal. Unfortunately, it is difficult to determine the specific frequency channel which yields the best signal quality. This difficulty occurs because signals may be detected in more than one channel due to imperfect out-of-band rejection of the channels adjacent to the one yielding the best reception quality, or the application of pulse modulated signals to the receiver which are prone to cause detections in different channels. Consequently, the receiver may be tuned to an inappropriate adjacent channel, resulting in imperfect signal reception, signal distortions, and general delays in data and/or voice reception. Thus, it is important to have a device which could determine the specific frequency channel over which a signal exhibits its largest amplitude. With this capability, a channelized receiver tuned to this specific frequency channel will receive the signal with minimized distortion.

It is known in the art to identify the frequency of an RF signal in a channelized receiver. An example of one patent that discloses such technique is U.S. Pat. No. 4,301,454, issued Nov. 17, 1981, entitled "Channelized Receiver System" by D. E. Bailey. The Bailey patent discloses a receiver which identifies the frequency channel in which an unknown signal is received by comparing the amplitude of a filtered signal having a largest amplitude with that of a filtered signal having a next largest amplitude. The receiver splits a received RF signal into at least two portions and applies each portion to a bank of filters. Each bank is comprised of filters defining alternate portions of a search bandwidth. Within each filter bank, the signal portions are applied to individual filters via circulators. When the frequency band of a particular filter corresponds to the signal's frequency, the signal is bandpassed through the filter. Where the signal frequency does not correspond to the filter frequency band, the signal rebounds back to the circulator which directs the signal to the next filter, where this process is repeated and continued.

The signal portions which pass through each filter bank are then applied to a voting logic device. The voting logic device determines the specific filters in each group having the largest amplitude output signals and compares the amplitude relationship that exists between these determined signals. When the filters having the largest output signals have pass bands defining contiguous portions of the search bandwidth, the signals are used by a computer preprogrammed with each of the filter pass band characteristics to calculate the RF signal frequency. The computer, which makes the calculations by determining the difference between the output signals, then generates a tuning signal to be used to tune a narrowband receiver to an appropriate frequency channel.

The teaching of Bailey is exemplary of the complexity of conventional approaches for determining the frequency of a received RF signal.

It is one object of this invention to provide for a simplified system of small physical size which quickly and accurately determines the frequency of a received RF signal for use in a channelized receiver, and that is suitable for receiving both continuous wave and intermittent (e.g., pulsed) transmission signals.

SUMMARY OF THE INVENTION

The foregoing and other problems are overcome and the object of the invention is realized by a method, and by an apparatus for accomplishing the method, for use in a channelized receiver for determining the frequency of an RF signal by: (1) sequentially applying a received RF signal to sequentially selected filters; (2) comparing the magnitude of the filtered signal to the magnitude of an unfiltered RF signal, (3) generating an output signal to a correlator when the filtered signal and unfiltered signal magnitudes are substantially equal; and (4) correlating the output signal to the bandpass frequency of the selected filtering means to determine the frequency of the RF signal.

In a preferred embodiment of the invention, individual ones of a plurality of filters have predetermined frequency pass bands that are sequentially selected by an input multiplexer in response to a control signal. A received RF signal is sequentially applied to each one of the selected filters and the filtered output signal is then routed to a first detector via an output multiplexer. The unfiltered RF signal is simultaneously applied to a second detector. The first and second detectors detect the magnitudes of the filtered output signal and the unfiltered RF signal, respectively. Each signal is then simultaneously applied to a subtractor which subtracts the magnitude of the filtered output signal from the magnitude of the unfiltered RF signal to produce a resulting difference signal. The resulting difference signal is then compared to a magnitude of a composite reference level with a comparator such that the comparator generates an output signal to a digital logic block when the respective magnitudes of the filtered and unfiltered signals are substantially equal. The magnitude of the filtered output signal is also compared to a threshold reference level magnitude via a second comparator such that the second comparator generates an output signal to the digital logic block when the magnitude of the filtered signal is greater than the magnitude of the threshold reference level. When the digital logic block receives appropriate output signals from both the first and second comparators, an output signal is reported to a correlator, such as a data processor, which determines the frequency of the RF signal by correlating the output signal to the band pass frequency of the selected filter.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1:
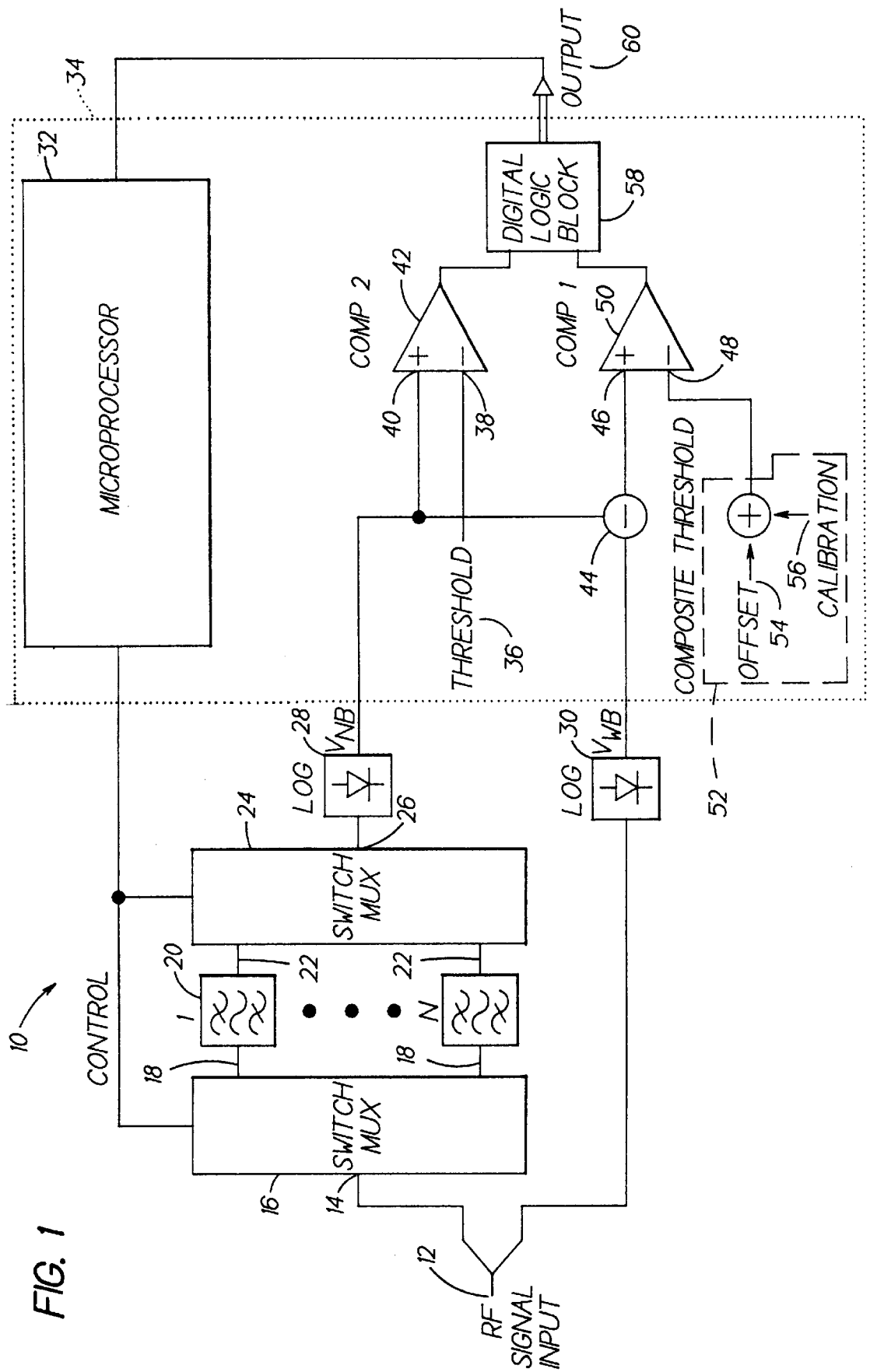
FIG. 1 is a block diagram of a preferred embodiment of a frequency detection system for a channelized receiver in accordance with the teaching of this invention.

An example of a detector system for determining the frequency of a received RF signal for a channelized receiver 10 is shown in FIG. 1. In this preferred embodiment, the system 10 is comprised of a first multiplexer 16 with an input 14 connected to an RF signal input 12, and a plurality of outputs 18, each of which is connected to an individual filter 20, of predetermined frequency pass band. The output of each individual filter is connected to one of a number of individual inputs 22 of a second multiplexer 24. Both the first and second multiplexers 16, 24 are controlled by a control device, such as a microprocessor 32. A first detector 28, designated as a "narrowband" detector, is connected to the output 26 of the second multiplexer 24. A second detector 30, designated as a "wideband" detector, is connected to the RF signal input 12. A Signal Processing Section 34 is connected to the outputs of the first and second detectors 28, 30. This Signal Processing Section 34 comprises a subtraction device 44, a comparator #1 50, a comparator #2 42, and a digital logic block 58. Comparator #2 42 is connected at its first input 40 to the output of the first detector 28. The second input 38 of comparator #2 42 is connected to a predetermined threshold level 36 which will be described below. The subtraction device 44 is connected to subtract the output signals of the first and second detectors 28, 30. The output of the subtraction device 44 is connected to a first input 46 of comparator #1 50. Comparator #1 50 is connected at its second input 48 to a predetermined composite threshold level 52, which will be described below. The outputs of comparator #1 50 and comparator #2 42 are connected to a digital logic block 58, which has an output 60 connected to the microprocessor 32. The digital logic block 58 may be implemented with any device known in the art for providing an output which depends upon logic levels present at the device's inputs, including but not limited to TTL, or CMOS circuits.

Figure 2A:
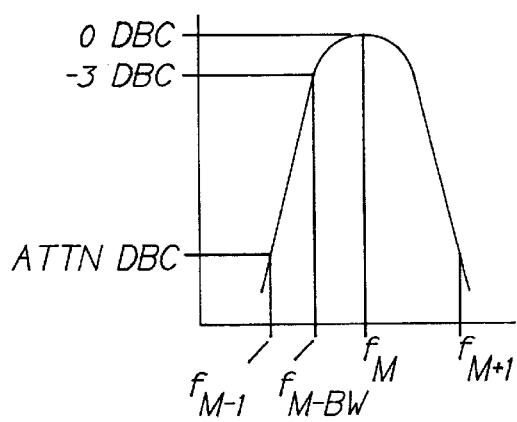
FIG. 2a illustrates the frequency response characteristics of a typical filter used in the channelized receiver of FIG. 1.
Figure 2B:
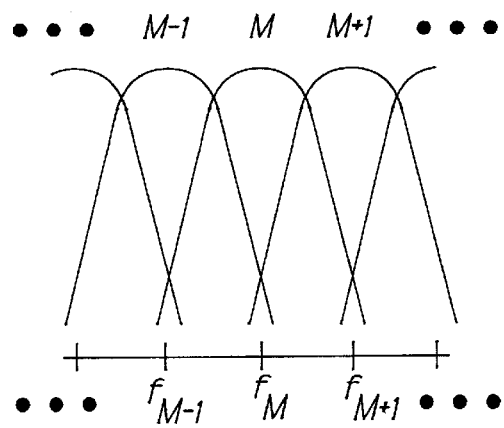
FIG. 2b illustrates the frequency response characteristics of a plurality of filters used in the channelized receiver of FIG. 1.
Figure 3:
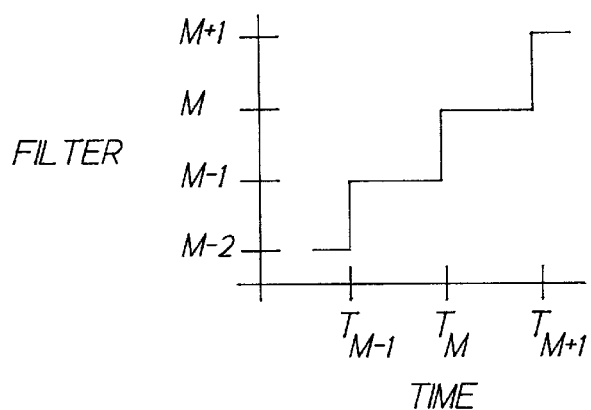
FIG. 3 is a timing diagram for the sequential selection of filters wherein each of the plurality of filters is selected in sequential order.

The first multiplexer 16 is controlled by a predetermined sequence of signals received from the microprocessor 32 to sequentially step through a number of channels over time, selecting one channel M over a selection time period. Each channel corresponds to a filter 20 connected to one of the first multiplexer's 16 respective channel outputs 18. A graphical representation of the channel and associated filter selection over time is shown in FIG. 3. A diagram of the characteristics of a typical filter 20 is shown in FIG. 2.

Figure 4A:
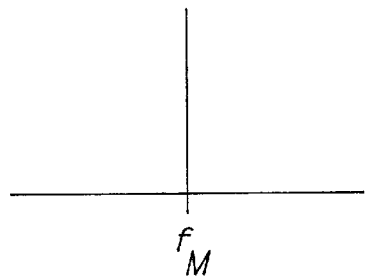
FIG. 4a is a diagrammatical representation of the frequency spectrum of a typical continuous wave input RF signal.
Figure 4B:
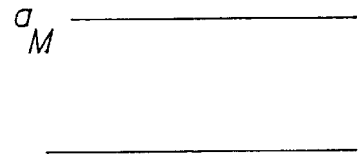
FIG. 4b is a diagrammatical representation of the amplitude versus time of a typical continuous wave input RF signal.
Figure 5A:
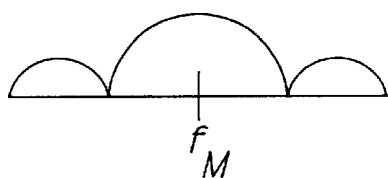
FIG. 5a is a diagrammatical representation of the frequency spectrum of a typical pulse wave input RF signal.
Figure 5B:
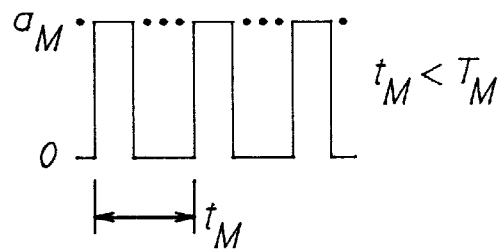
FIG. 5b is a diagrammatical representation of the amplitude versus time of a typical pulse wave input RF signal.

When an RF signal, which can be an unmodulated continuous wave signal or a pulse modulated wave signal (see FIG. 4 and FIG. 5, respectively), of unknown frequency is received by the RF signal input 12 of the detector system 10, the signal is routed to two places. First, in response to the control signal received from the microprocessor 32, the multiplexer 16 selects a channel over a time sufficient to capture the received RF signal, and routes the RF signal to the filter 20 connected to the output of selected channel M. The selected filter 20 then passes the portion of the RF signal that has a frequency which matches the band pass frequency of the selected filter 20 to the "narrowband" detector 28 via the second multiplexer 24. Similar to the first multiplexer 16, the second multiplexer 24 is controlled to select the same channel M as that selected by the first multiplexer 16 over the same time period, thus allowing it to receive and retransmit the filtered signal output from a currently selected filter 20.

The second place the unfiltered RF signal is routed is to a "wideband" detector 30. The application of the unfiltered RF signal to the "wideband" detector 30 occurs simultaneously with the application of the bandpassed RF signal to the "narrowband" detector 28. When the "wideband" detector 30 and the "narrowband" detector 28 detect the presence of a signal at their respective inputs, each emits an output signal Vwb and Vnb, respectively. The detectors 28, 30 have characteristics such that their respective output signals Vwb and Vnb are linearly proportional to the power of their respective input signals. When a continuous wave RF signal is received by the channelized receiver 10 and input to the RF signal input 12, the amplitude of signal Vwb is continuous over time since Vwb represents the detected unfiltered RF signal. The amplitude of signal Vnb, however, changes per each time period due to the sequential application of the continuous wave input signal to each filtering means over that same time period. When a pulsed wave RF signal is received by the channelized receiver 10 and input to the RF signal input 12, the peak amplitudes of each pulse signal Vwb are continuous amplitude over time since Vwb represents the detected unfiltered RF signal. The peak amplitudes of each pulsed signal Vnb, however, changes per each time period due to the sequential application of the pulse input signal to each filtering means over that same time period.

It should be noted that the "narrowband" detector 28 and the "wideband" detector 30 may both be implemented with the same type of detector (e.g., a diode detector), and that their designations as to narrow and wide bandwidth refer to their respective input signals.

Output signals Vwb and Vnb are then applied to the Signal

Processing Section 34. Within the Signal Processing Section 34, the signals are subtracted by the subtraction device 44, such as a differential amplifier, and the resulting difference signal is then applied to comparator #1 50 where it is compared with the composite threshold level 52. The composite threshold level 52 is preferably composed of an offset level 54 and a calibration level 56. The offset level 54 is adjusted so that comparator #1 50 changes state when the amplitude of signal Vnb is substantially equal to that of signal Vwb. The calibration level 56 is adjusted to compensate for any RF gain or loss that may occur between the wideband and narrowband channels.

The output of comparator #1 50 changes state when a relationship exists between the resulting difference signal and the composite threshold level 52 which is substantially equivalent to a relationship predefined by a characteristic of comparator #1 50. The predefined relationship is defined as the one between the signals (the composite threshold level magnitude 52 and the resulting difference signal magnitude) applied to the two inputs 46, 48 of comparator #1 50, which causes the output of comparator #1 to change state. The predefined relationship is set such that the output of comparator #1 50 changes state when signals Vnb and Vwb are substantially equal, and hence, the resulting difference signal magnitude substantially equals zero.

The output signal Vnb of the "narrowband" detector 28 is also applied to comparator #2 42 where it is compared with the predetermined threshold level 36 to determine whether the narrowband signal has sufficient amplitude to warrant further processing. When signals with amplitudes less than the amplitude of the predetermined threshold level 36 are applied to comparator #2 42, no signal is generated by the detecting system 10 to the microprocessor 32 via digital logic block output 60. Thus, the predetermined threshold level is set to a magnitude which will prevent the unwanted processing of signals with insufficient amplitudes, such as those derived from electrical noise. The output of comparator #2 42 changes state when the narrowband signal exceeds the predetermined threshold level 36.

Figure 6A:
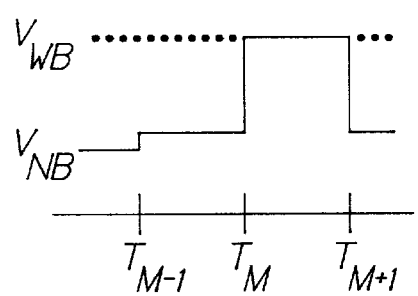
FIG. 6a illustrates a diagram of signals designated Vnb and Vwb, which emanate from the first and second detectors, respectively, in response to the continuous wave input signal shown in FIG. 4b.
Figure 6B:
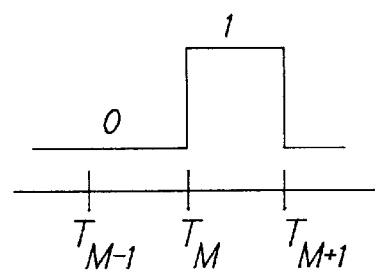
FIG. 6b is a diagram representing the output signal of the digital logic block in response to the application of the signal represented in FIG. 6a to the Signal Processing Section.
Figure 7A:
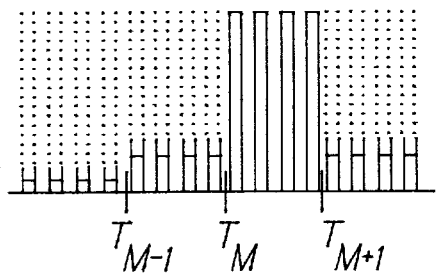
FIG. 7a illustrates a diagram of the signals Vnb and Vwb, which emanate from the first and second detectors in response to the pulsed wave input signal shown in FIG. 5b.
Figure 7B:
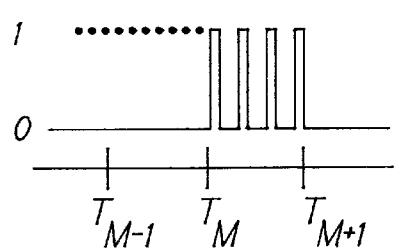
FIG. 7b is a diagram representing an output signal of the digital logic block in response to the application of the signal represented in FIG. 7a to the Signal Processing Section.

The outputs of comparator #1 50 and comparator #2 42 are connected to a digital logic block 58 which provides an output signal to the microprocessor 32 when the digital logic block 58 receives appropriate signals from both comparator #1 50 and comparator #2 42. Comparator #1 50 and comparator #2 42 must both indicate a response for there to be valid detection. The microprocessor 32 then correlates the digital logic block output signal with the selected filter bandwidth to determine the frequency band over which the RF signal has its largest amplitude. See FIG. 6 and FIG. 7, respectively, for diagrams of the detected signals Vnb and Vwb, and the digital logic block output responses for the continuous wave and pulse wave input signal applications shown in FIG. 4 and FIG. 5 respectively.

It should be particularly noted that this invention is capable of channeliziнq received signals of durations shorter than 200 nanoseconds and bandwidths exceeding 100 megahertz.

While the invention has been particularly shown and described with respect to a preferred embodiment thereof, it will be understood by those skilled in the art that changes in form and details may be made therein without departing from the scope and spirit of the invention. By example, the duration or dwell time for the selection signal (FIG. 3) is adjusted to ensure that sufficient energy is captured from the received signal. When receiving pulsed signals, the dwell time should take into account the pulse repetition rate of the received signal. Also by example, it is within the scope of this invention to incorporate the digital logic block 58 into the microprocessor 32, and to thus connect the outputs of comparators #1 and #2, either directly or through level shifting circuitry, to input ports of the microprocessor.

What is claimed is:

1. A method for determining a frequency of an RF signal, comprising the steps of:

sequentially applying the RF signal to selected individual ones of a plurality of filters, each of the plurality of filters having a predetermined pass band;

determining magnitudes of signals that are output from individual ones of the plurality of filters;

comparing each individual one of the determined magnitudes to a magnitude of the RF signal by applying each respective individual filter output signal and the RF signal to a comparing device; and determining a frequency of the RF signal as being within the predetermined frequency pass band of a filter that outputs a largest magnitude output signal relative to the magnitude of the RF signal, and where the filter output signal magnitude exceeds a first predetermined reference magnitude level.

2. An apparatus for determining a frequency of an RF signal comprising:

switchable filter means for sequentially applying an input RF signal to selected individual ones of a plurality of filtering means, each of said plurality of filtering means having a predetermined frequency pass band;

detecting means, coupled to an output of said switchable filter means, for determining a magnitude of an output signal emanating from each of said individual filtering means; and processing means, coupled to an output of said detecting means, for comparing each individual one of the means, for comparing each individual one of the determined magnitudes to a magnitude of the input RF signal to determine a frequency of the input RF signal as being within the predetermined frequency pass band of the individual filtering means that outputs a largest magnitude relative to the magnitude of the input RF signal, and where the individual one determined magnitude also exceeds a first predetermined reference magnitude level.

3. An apparatus for determining a frequency of an RF signal as set forth in claim 2 wherein the switchable filter means includes:

input means, said input means having an input coupled to said input RF signal, said input means also having a plurality of outputs, said input means being responsive to an applied command for selecting one of said plurality of outputs for outputting the input RF signal;

output means, having a plurality of inputs and an output, said output means being responsive to an applied command for selecting one of said plurality of inputs of said output means to forward a signal applied to the selected one of the inputs to said output of said output means; and a bank of filtering means, each individual one of said filtering means having a predetermined frequency pass band and being coupled between a respective individual one of said outputs of the input means and a respective individual one of said inputs of said output means.

4. A method for determining a frequency of an RF signal, comprising the steps of:

sequentially applying the RF signal to selected individual ones of a plurality of filters, each of the plurality of filters having a predetermined pass band;

determining a magnitude of an output signal emanating from individual ones of the plurality of filters;

comparing individual ones of the determined magnitudes to a magnitude of the RF signal; and determining a frequency of the RF signal as being within the predetermined frequency pass band of a filter that outputs a largest magnitude output signal relative to the magnitude of the RF signal, and where the filter output signal magnitude exceeds a first predetermined reference magnitude level;

wherein the steps of comparing individual ones of the determined magnitudes to a magnitude of the RF signal and determining a frequency of the RF signal include the steps of:

subtracting the magnitude of an output signal emanating from individual ones of the plurality of filters from a magnitude of the RF signal to produce a difference output signal;

comparing the difference output signal magnitude to a second predetermined reference magnitude level;

reporting a signal to a loqic block when a relationship exists between the difference output signal magnitude and the second predetermined reference magnitude level which is substantially equivalent to a predefined relationship, and where the magnitude of the output signal emanating from individual ones of the plurality of filters and the magnitude of the RF signal are substantially equal, wherein the predefined relationship is defined by a characteristic of a first comparator; and correlating the reported signal to the predetermined frequency pass band of the one individual filter that outputs a largest magnitude signal to determine a frequency of the RF signal.

5. A method as set forth in claim 4 wherein the second predetermined reference magnitude level is adjustably set to a magnitude that is offset relative to the magnitude of the difference output signal such that a signal is reported to the logic block when the magnitude of the output signal emanating from individual ones of the plurality of filters is substantially equal to the magnitude of the RF signal.

6. An apparatus for determining a frequency of an RF signal comprising:

switchable filter means for sequentially applying the RF signal to selected individual ones of a plurality of filtering means, each of said plurality of filtering means having a predetermined frequency pass band;

detecting means, coupled to an output of said switchable filter means, for determining a magnitude of an output signal emanating from said individual filtering means; and processing means, coupled to an output of said detecting means, for comparing individual ones of the determined magnitudes to a magnitude of the RF signal to determine a frequency of the RF signal as being within the predetermined frequency pass band of the individual filtering means that outputs a largest magnitude relative to the magnitude of the RF signal, and where the individual one determined magnitude also exceeds a first predetermined reference magnitude level;

wherein the processing means includes:

subtracting means, coupled to the output of said detecting means, for subtracting the magnitude of an output signal emanating from said individual filtering means from the magnitude of the RF signal to produce a resulting difference signal;

first comparing means, having a first input coupled to an output of said subtracting means and a second input coupled to a second predetermined reference magnitude level, for comparing the resulting difference signal magnitude to the second predetermined reference magnitude level and generating an output signal when a relationship exists between the resulting subtraction signal magnitude and the second predetermined reference magnitude level which is substantially equivalent to a predefined relationship, and where the magnitude of the output signal emanating from individual ones of the plurality of filtering means and the magnitude of the RF signal are substantially equal, wherein the predefined relationship is defined by a characteristic of said first comparing means;

second comparing means, having a first input coupled to the output of said detecting means and a second input coupled to the first predetermined reference magnitude level, for comparing said detecting means output signal magnitude to the first predetermined reference magnitude level and generating an output signal when the detecting means output signal magnitude exceeds the first predetermined reference magnitude level;

logic means, coupled to the outputs of the first and second comparing means, for reporting a signal to a microprocessor means when output signals are received by the logic means from both the first and second comparing means; and said microprocessor means being coupled to the output of said logic means and to at least one control input of said switchable filter means, for correlating the reported signal received from said logic means to the predetermined frequency pass band of the one individual filtering means that outputs the largest magnitude signal to determine the frequency of the RF signal.

7. An apparatus for determining a frequency of an RF signal as set forth in claim 6 wherein the second predetermined reference magnitude level is adjustably set to a magnitude that is offset relative to the magnitude of the subtraction output signal such that a signal is reported by said second comparing means to the microprocessor means when a magnitude of an output signal emanating from individual ones of the plurality of filtering means is substantially equal to the magnitude of the RF signal.

8. A method for determining a frequency of an RF signal, comprising the steps of:

sequentially applying an input RF signal to selected individual ones of a plurality of filters, each of the plurality of filters having a predetermined pass band;

determining a magnitude of each individual signal that is output from each individual one of the plurality of filters;

comparing a magnitude of the input RF signal to each individual one of the determined magnitudes of the individual filter output signals by applying the input RF signal and each respective one of the individual filter output signals to a comparing device; and determining a frequency of the input RF signal as being within the predetermined frequency pass band of one of the plurality of filters that outputs a largest magnitude signal relative to the magnitude of the input RF signal.

9. An apparatus for determining a frequency of an RF signal comprising:

switchable filter means for sequentially applying an input RF signal to selected individual ones of a plurality of filtering means, each of said plurality of filtering means having a predetermined frequency pass band;

means for determining a magnitude of the input RF signal and respective magnitudes of signals that are output by individual ones of said plurality of filtering means; and processing means, said processing means having an input coupled to an output of said determining means, said processing means for comparing the determined magnitude of the input RF signal to each individual one of the determined magnitudes of the signals output by said individual filtering means and determining a frequency of the input RF signal as being within the predetermined frequency pass band of one of the individual filtering means that outputs a largest magnitude signal relative to the magnitude of the input RF signal.

* * * * *